United States Patent
Liu et al.

(10) Patent No.: US 12,396,341 B2
(45) Date of Patent: Aug. 19, 2025

(54) ENLARGING ACTIVE AREAS OF DISPLAYS IN ELECTRONIC DEVICES

(71) Applicant: Google LLC, Mountain View, CA (US)

(72) Inventors: Chun-Yen Liu, Zhubei (TW); Chiaching Chu, New Taipei (TW); Ion Bita, Los Altos, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/426,046

(22) Filed: Jan. 29, 2024

(65) Prior Publication Data
US 2024/0290272 A1    Aug. 29, 2024

Related U.S. Application Data

(60) Provisional application No. 63/486,593, filed on Feb. 23, 2023.

(51) Int. Cl.
*H10K 59/131* (2023.01)
*G09G 3/3233* (2016.01)
(Continued)

(52) U.S. Cl.
CPC ......... *H10K 59/131* (2023.02); *G09G 3/3233* (2013.01); *G09G 3/3241* (2013.01);
(Continued)

(58) Field of Classification Search
CPC ........ G04G 17/00; G04G 17/02; G04G 17/04; G04G 17/045; G09G 3/3233;
(Continued)

(56) References Cited

U.S. PATENT DOCUMENTS

| 9,697,758 B2 | 7/2017 | Watanabe et al. |
| 10,021,226 B2 | 7/2018 | Gagne-Keats et al. |

(Continued)

FOREIGN PATENT DOCUMENTS

| CN | 103488364 A | 1/2014 |
| CN | 109254683 A | 1/2019 |

(Continued)

OTHER PUBLICATIONS

"International Search Report and Written Opinion", Application No. PCT/US2024/013362, May 31, 2024, 15 pages.

(Continued)

*Primary Examiner* — Julie Anne Watko
(74) *Attorney, Agent, or Firm* — Colby Nipper PLLC

(57) ABSTRACT

This document describes systems and techniques directed at enlarging active areas of displays in electronic devices. In aspects, a display includes a grid of transistors positioned within a display panel module to control an illumination of one or more electroluminescent layers. Routing lines extend from one or more transistors of the grid of transistors to at least one electroluminescent layer. In this way, the at least one electroluminescent layer can be positioned away from the grid of transistors and disposed above portions of display panel module driving circuitry. As a result, active areas of displays can be enlarged and information content can be maximized without a panel border area allotted to the display panel module driving circuitry surrounding transistors having to be reduced.

21 Claims, 10 Drawing Sheets

(51) Int. Cl.
  *H10K 59/123* (2023.01)
  *H10K 59/126* (2023.01)
  *G09G 3/3241* (2016.01)

(52) U.S. Cl.
  CPC ............ *G09G 2300/0426* (2013.01); *G09G 2300/0876* (2013.01); *G09G 2320/0209* (2013.01); *G09G 2320/0219* (2013.01); *G09G 2320/0233* (2013.01); *H10K 59/123* (2023.02); *H10K 59/126* (2023.02)

(58) Field of Classification Search
  CPC ............ G09G 3/3241; G09G 3/3258; G09G 2300/0426; G09G 2300/0876; G09G 2320/0209; G09G 2320/0233; H10K 59/123; H10K 59/126; H10K 59/131; H10K 59/1213; H10K 59/353; G06F 3/04164
  See application file for complete search history.

(56) References Cited

U.S. PATENT DOCUMENTS

| | | |
|---|---|---|
| 10,068,551 B1 | 9/2018 | Choi et al. |
| 10,440,839 B2 | 10/2019 | Cheng |
| 10,510,317 B2 | 12/2019 | Spence et al. |
| 10,742,788 B2 | 8/2020 | Shin et al. |
| 10,838,452 B2 | 11/2020 | Siddiqui et al. |
| 10,890,954 B2 | 1/2021 | Evans et al. |
| 11,163,970 B1 | 11/2021 | Sammoura et al. |
| 11,403,984 B2 | 8/2022 | Jung et al. |
| 12,008,836 B2 | 6/2024 | Kim et al. |
| 2006/0093928 A1 | 5/2006 | Hung et al. |
| 2007/0070272 A1 | 3/2007 | Gettemy et al. |
| 2008/0123032 A1 | 5/2008 | Taniguchi et al. |
| 2010/0053853 A1 | 3/2010 | Allore et al. |
| 2011/0175852 A1 | 7/2011 | Goertz et al. |
| 2013/0088671 A1 | 4/2013 | Drzaic et al. |
| 2013/0342519 A1 | 12/2013 | Kim et al. |
| 2014/0118985 A1 | 5/2014 | Hassember |
| 2014/0240911 A1 | 8/2014 | Cole et al. |
| 2014/0265822 A1 | 9/2014 | Drzaic et al. |
| 2015/0070826 A1 | 3/2015 | Montevirgen et al. |
| 2015/0138434 A1 | 5/2015 | Chuang et al. |
| 2015/0287352 A1 | 10/2015 | Watanabe et al. |
| 2015/0301417 A1 | 10/2015 | Park et al. |
| 2015/0331292 A1 | 11/2015 | Yang et al. |
| 2016/0063933 A1 | 3/2016 | Kobayashi et al. |
| 2016/0078838 A1 | 3/2016 | Huang et al. |
| 2016/0078846 A1 | 3/2016 | Liu et al. |
| 2016/0170509 A1 | 6/2016 | Notermans |
| 2016/0227654 A1 | 8/2016 | Kim et al. |
| 2016/0266677 A1 | 9/2016 | Liu et al. |
| 2016/0337570 A1 | 11/2016 | Tan et al. |
| 2017/0092196 A1 | 3/2017 | Gupta et al. |
| 2017/0116932 A1 | 4/2017 | Musgrave et al. |
| 2017/0168463 A1 | 6/2017 | Hong et al. |
| 2017/0200054 A1 | 7/2017 | Du et al. |
| 2017/0322357 A1 | 11/2017 | De Jong et al. |
| 2018/0012006 A1 | 1/2018 | Suh et al. |
| 2018/0018501 A1 | 1/2018 | Mather et al. |
| 2018/0040301 A1 | 2/2018 | Bae et al. |
| 2018/0047799 A1* | 2/2018 | Lim ................... H10K 59/88 |
| 2018/0137332 A1 | 5/2018 | Andersen et al. |
| 2018/0151109 A1 | 5/2018 | Shim et al. |
| 2018/0165508 A1 | 6/2018 | Othman et al. |
| 2018/0260602 A1 | 9/2018 | He et al. |
| 2018/0285619 A1 | 10/2018 | Kim et al. |
| 2018/0300526 A1 | 10/2018 | Cho et al. |
| 2018/0301080 A1 | 10/2018 | Shigeta et al. |
| 2019/0057660 A1 | 2/2019 | Lee et al. |
| 2019/0079623 A1 | 3/2019 | Kim et al. |
| 2019/0197944 A1 | 6/2019 | Kim et al. |
| 2019/0228740 A1 | 7/2019 | Aflatooni et al. |
| 2019/0303639 A1 | 10/2019 | He et al. |
| 2019/0303642 A1 | 10/2019 | He et al. |
| 2020/0035202 A1 | 1/2020 | Aflatooni et al. |
| 2020/0050818 A1 | 2/2020 | He et al. |
| 2020/0117933 A1 | 4/2020 | Chang et al. |
| 2020/0273427 A1 | 8/2020 | Wang |
| 2020/0327348 A1 | 10/2020 | Kim |
| 2020/0403186 A1 | 12/2020 | Choi et al. |
| 2021/0036091 A1* | 2/2021 | Kwak ............... H10K 59/131 |
| 2021/0056281 A1 | 2/2021 | Shih et al. |
| 2021/0201731 A1 | 7/2021 | Ranjan et al. |
| 2021/0209327 A1 | 7/2021 | Wu et al. |
| 2021/0232791 A1 | 7/2021 | Wang |
| 2021/0248350 A1 | 8/2021 | Chang et al. |
| 2021/0264181 A1 | 8/2021 | Park et al. |
| 2021/0271851 A1 | 9/2021 | Chou et al. |
| 2021/0333928 A1 | 10/2021 | Wu et al. |
| 2021/0335325 A1 | 10/2021 | Her et al. |
| 2021/0408140 A1 | 12/2021 | Han et al. |
| 2022/0036810 A1 | 2/2022 | Gu |
| 2022/0043488 A1 | 2/2022 | Lombardi et al. |
| 2022/0050506 A1 | 2/2022 | Gehlen et al. |
| 2022/0058254 A1 | 2/2022 | Park et al. |
| 2022/0066613 A1 | 3/2022 | Yuan et al. |
| 2022/0091637 A1 | 3/2022 | Kuon et al. |
| 2022/0130308 A1 | 4/2022 | Jung et al. |
| 2022/0148536 A1 | 5/2022 | Choi |
| 2022/0165083 A1 | 5/2022 | Lin et al. |
| 2022/0254857 A1* | 8/2022 | Xu ........................ G09G 3/3233 |
| 2022/0320243 A1* | 10/2022 | Huang ............... H10K 59/1213 |
| 2022/0328590 A1* | 10/2022 | Kim ................... H10K 59/353 |
| 2022/0391086 A1 | 12/2022 | Westerman |
| 2023/0010411 A1* | 1/2023 | Park ................... H10K 59/131 |
| 2023/0088192 A1 | 3/2023 | Qin et al. |
| 2023/0274573 A1 | 8/2023 | Kim et al. |
| 2023/0306912 A1 | 9/2023 | Wen et al. |
| 2024/0105142 A1 | 3/2024 | Jeon et al. |
| 2024/0161548 A1 | 5/2024 | Kim et al. |
| 2024/0193985 A1 | 6/2024 | Sammoura et al. |
| 2024/0264740 A1 | 8/2024 | Zou et al. |
| 2024/0292660 A1 | 8/2024 | Liu et al. |
| 2024/0298509 A1 | 9/2024 | Gong et al. |
| 2025/0028403 A1 | 1/2025 | Liu et al. |

FOREIGN PATENT DOCUMENTS

| | | | |
|---|---|---|---|
| CN | 111241890 | 6/2020 | |
| CN | 111477135 | 7/2020 | |
| CN | 111668278 A * | 9/2020 | ............ G09G 3/3233 |
| CN | 112331145 | 2/2021 | |
| CN | 113053306 | 6/2021 | |
| CN | 114187867 | 3/2022 | |
| CN | 114913773 | 8/2022 | |
| CN | 117351895 A | 1/2024 | |
| EP | 3057084 A2 | 8/2016 | |
| EP | 3522229 A1 | 8/2019 | |
| EP | 3770740 A1 | 1/2021 | |
| EP | 3786768 A1 | 3/2021 | |
| EP | 3992705 A1 | 5/2022 | |
| EP | 4095917 A1 * | 11/2022 | ............ G09G 3/3233 |
| KR | 20160080768 | 7/2016 | |
| KR | 102279278 | 7/2021 | |
| TW | 202046272 A | 12/2020 | |
| TW | 202318385 A | 5/2023 | |
| WO | 2015188595 A1 | 12/2015 | |
| WO | 2020192051 A1 | 10/2020 | |
| WO | 2021257108 | 12/2021 | |
| WO | 2022046025 | 3/2022 | |
| WO | WO-2022046025 A1 * | 3/2022 | ......... G02F 1/133388 |
| WO | 2022105484 | 5/2022 | |
| WO | 2022232996 | 11/2022 | |
| WO | 2023229653 | 11/2023 | |
| WO | 2024177787 | 8/2024 | |
| WO | 2024191557 A1 | 9/2024 | |

(56) References Cited

FOREIGN PATENT DOCUMENTS

| WO | 2024229035 A1 | 11/2024 |
|----|---------------|---------|
| WO | 2025019436 A1 | 1/2025  |

OTHER PUBLICATIONS

"Notice of Allowance", U.S. Appl. No. 18/313,138, filed Mar. 12, 2024, 7 pages.
"International Search Report and Written Opinion", Application No. PCT/US2024/027072, Jul. 23, 2024, 12 pages.
Li, et al., "Advanced Metrology for Display Uniformity Performance Judgement", Technical Disclosure Commons, https://www.tdcommons.org/dpubs_series/7119, Jun. 21, 2024, 10 pages.
"Foreign Office Action", IN Application No. 202247031876, Aug. 7, 2023, 7 pages.
"Foreign Office Action", JP Application No. 2022-536640, Sep. 5, 2023, 4 pages.
"International Preliminary Report on Patentability", Application No. PCT/US2020/047670, Feb. 28, 2023, 10 pages.
"International Search Report and Written Opinion", Application No. PCT/US2022/072601, Jan. 16, 2023, 12 pages.
"International Search Report and Written Opinion", Application No. PCT/US2020/047670, May 12, 2021, 13 pages.
"LG Introduces New Foldable Display Tech That's Hard as Glass, Has no Creases", https://www.gsmarena.com/lg_introduces_new_foldable_display_material_with_no_creases_hard_as_glass-news-50837.php, Sep. 7, 2021, 1 page.
"Non-Final Office Action", U.S. Appl. No. 17/507,293, filed Feb. 17, 2023, 7 pages.
"Non-Final Office Action", U.S. Appl. No. 17/586,386, filed Oct. 24, 2022, 5 pages.
Choi, et al., "Disabling Transitions When Encoded Intensity is Low", Application No. PCT/US2021/070522, filed May 10, 2021, 46 pages.
Choi, et al., "Expediting Fingerprint Authentication by Compensating for Display Luminance Latency", Technical Disclosure Commons, https://www.tdcommons.org/dpubs_series/4686, Oct. 29, 2021, 11 pages.
Choi, et al., "Light-Guiding Structure for Under-Display Sensor Modules", Technical Disclosure Commons; https://www.tdcommons.org/dpubs_series/3527, Aug. 17, 2020, 8 pages.
Chugh, et al., "Fingerprint Spoof Detection: Temporal Analysis of Image Sequence", Dec. 17, 2019, 8 pages.
Ghiani, et al., "Fingerprint liveness detection using Binarized Statistical Image Features", Oct. 2013, 6 pages.
Hou, et al., "Foldable Display Stack-Up Structures with a Divided Thin Glass Layer", Technical Disclosure Commons—https://www.tdcommons.org/dpubs_series/6406, Nov. 8, 2023, 10 pages.
Karri, et al., "User Interface Mitigation of Display Artifacts During Transitions between Display Clock Speeds", Technical Disclosure Commons, https://www.tdcommons.org/dpubs_series/5427, Nov. 4, 2022, 7 pages.
Li-Fong, et al., "A Circular Flexible Amoled Display with a 1-mm Slim Border", May 25, 2016, pp. 847-850.
Lih, et al., "A True Circular 1.39 Inch Amoled for Wearable Application", May 2016, pp. 566-569.
Lombardi, et al., "Adaptive User Interface for a Camera Aperture within an Active Display Area", Technical Disclosure Commons; Retrieved from https://www.tdcommons.org/dpubs_series/2719, Nov. 25, 2019, 12 pages.
Matei, Mihai, "Samsung's Ultra-Thin Glass is no Good for Large Foldable Tablets or Laptops", https://www.sammobile.com/news/samsung-ultra-thin-glass-no-good-for-large-foldable-tablets-laptops/, Aug. 29, 2022, 5 pages.
Ojala, et al., "Multiresolution Gray-Scale and Rotation Invariant Texture Classification with Local Binary Patterns", Jul. 2002, pp. 971-987.
Sammoura, et al., "Fingerprint-Matching Algorithm Using Polar Shapelets", Technical Disclosure Commons; Retrieved from https://www.tdcommons.org/dpubs_series/2471, Sep. 10, 2019, 17 pages.
Sammoura, et al., "Safeguarding Biometric Authentication Systems from Fingerprint Spoof Attacks", Technical Disclosure Commons; Retrieved from https://www.tdcommons.org/dpubs_series/2769, Dec. 16, 2019, 13 pages.
Sammoura, et al., "Spoof Detection for Fingerprint Sensors", Technical Disclosure Commons; Retrieved from https://www.tdcommons.org/dpubs_series/2648, Nov. 5, 2019, 12 pages.
Shin, et al., "Dynamic Voltage Scaling of OLED Displays", Jun. 2011, 6 pages.
Skanda, Sai, "Xiaomi Mi 9 to Feature an Improved In-screen Fingerprint Sensor", https://www.gizchina.com/2019/02/17/mi-9-fingerprint-improved-fingerprint/, Feb. 17, 2019, 10 pages.
Wen, et al., "Improving Under-Display Fingerprint Authentication Latency by Normalizing Frame Luminance", Technical Disclosure Commons—https://www.tdcommons.org/dpubs_series/5006, Mar. 24, 2022, 12 pages.
Yonebayashi, et al., "High refresh rate and low power consumption AMOLED panel using top-gate n-oxide and p-LTPS TFTs", Mar. 2020, 10 pages.
"International Preliminary Report on Patentability", Application No. PCT/US2024/027072, Nov. 11, 2024, 7 pages.
"International Search Report and Written Opinion", Application No. PCT/US2024/038067, Sep. 24, 2024, 15 pages.
"International Search Report and Written Opinion", Application No. PCT/US2024/016511, Dec. 17, 2024, 12 pages.
Bai, et al., "On-Pixel Ratio-Based Adjustment of Local High Brightness Control", Oct. 8, 2024, 13 pages.
Eltoft, et al., "Adaptive Maximum Fingerprint Touch-Size Threshold for Reduced Unintended Authentication Attempts and Reduced Spoof Accept Rate", Technical Disclosure Commons, https://www.tdcommons.org/dpubs_series/7586, Nov. 22, 2024, 12 pages.
"Foreign Office Action", TW Application No. 113126707, Apr. 9, 2025, 14 pages.
Mienko, et al., "Ultra-dark" OLED Panel Combining Polarization and Masking Layers, Technical Disclosure Commons, https://www.tdcommons.org/dpubs_series/7923, Mar. 18, 2025, 12 pages.
"Non-Final Office Action", U.S. Appl. No. 18/773,080, May 8, 2025, 10 pages.

* cited by examiner

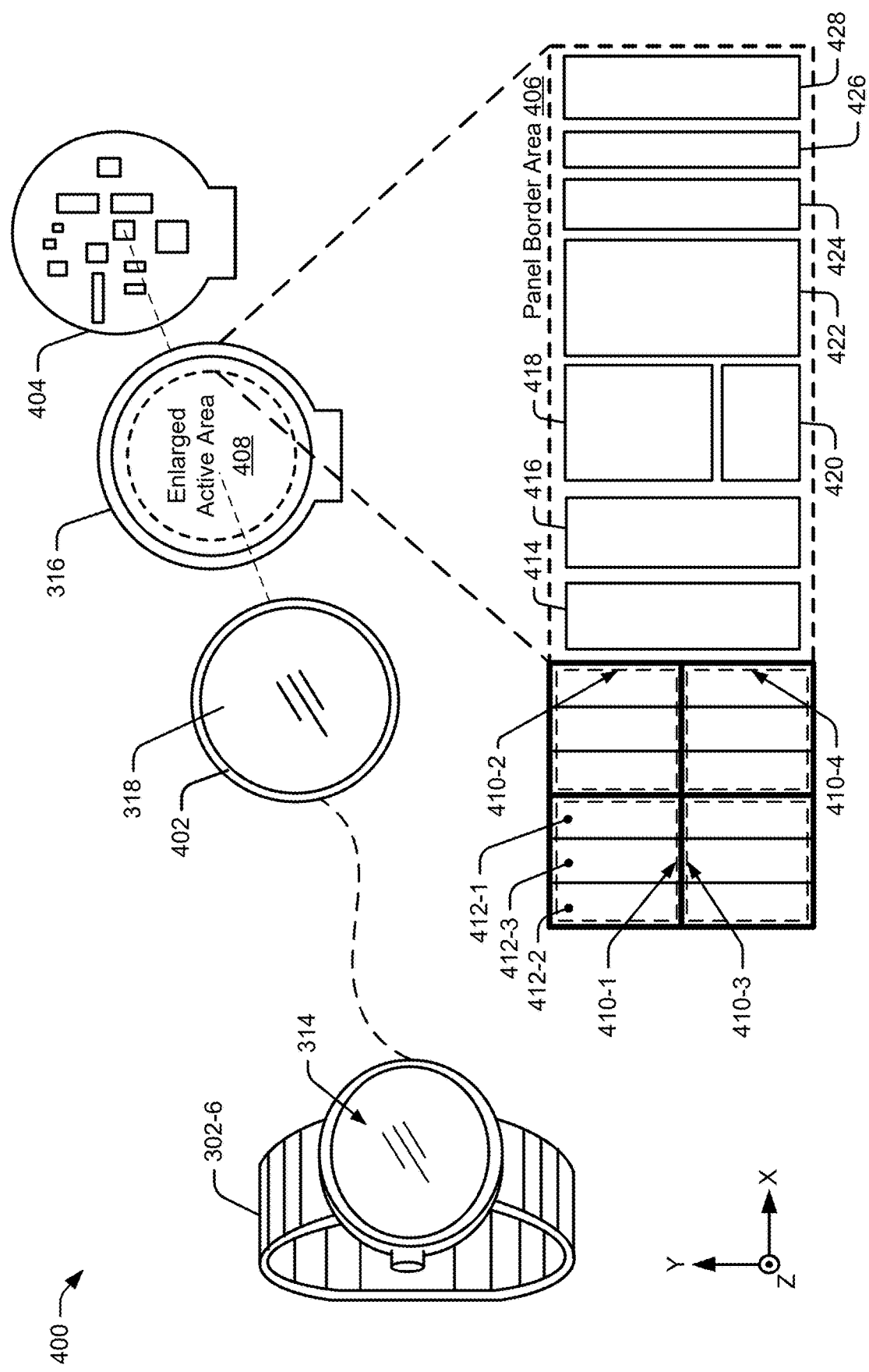

ENLARGING ACTIVE AREAS OF DISPLAYS IN ELECTRONIC DEVICES

CROSS-REFERENCE TO RELATED APPLICATIONS

This application claims priority to U.S. Provisional Application Ser. No. 63/486,593, filed Feb. 23, 2023, the disclosure of which is incorporated herein by reference in its entirety.

BACKGROUND

Wearable electronic devices, such as virtual-reality goggles and smartwatches, are increasing in popularity. These wearable devices are able to synchronize and communicate wireless data with other devices, including non-wearable devices like smartphones and laptops. Such wireless interconnectivity promotes user connectivity, productivity, and efficiency. In one example, upon receipt of an email notification, a laptop can wirelessly transmit the email notification to a smartwatch for viewing on its respective display. This technique and others like it afforded by wearable devices provide many conveniences and are therefore highly valued by users.

SUMMARY

This document describes systems and techniques directed at enlarging active areas of displays in electronic devices. In aspects, a display includes a grid of transistors positioned within a display panel module to control an illumination of one or more electroluminescent layers. Routing lines extend from one or more transistors of the grid of transistors to at least one electroluminescent layer. In this way, the at least one electroluminescent layer can be positioned away from the grid of transistors and disposed above portions of display panel module driving circuitry. As a result, active areas of displays can be enlarged and information content can be maximized without a panel border area allotted to the display panel module driving circuitry surrounding transistors having to be reduced.

In aspects, a display is disclosed that includes an electroluminescent layer that is configured to emit light when a voltage is applied across a cathode and an anode. The display further includes a transistor configured to control an electrical activation of the electroluminescent layer by controlling the voltage across the cathode and the anode. The display also includes driving circuitry operatively coupled to the transistor and configured to control the transistor. Further, the display includes a routing line connected to an electrode of the transistor. Additionally, the display includes a routing metal operatively coupling the anode of the electroluminescent layer to the routing line. The routing metal extends from the routing line above at least portions of the driving circuitry. The electroluminescent layer is disposed above the at least portions of the driving circuitry via the operative coupling to the routing metal.

This Summary is provided to introduce simplified concepts of systems and techniques directed at enlarging active areas of displays in electronic devices, the concepts of which are further described below in the Detailed Description and Drawings. This Summary is not intended to identify essential features of the claimed subject matter, nor is it intended for use in determining the scope of the claimed subject matter.

BRIEF DESCRIPTION OF THE DRAWINGS

The details of one or more aspects of systems and techniques directed at enlarging active areas of displays in electronic devices are described in this document with reference to the following drawings:

FIG. 4 illustrates an example implementation of a smart-watch and an exploded view of an example display having a display panel module, a display cover layer, and integrated circuits;

The same numbers are used throughout the Drawings to reference like features and components.

DETAILED DESCRIPTION

Overview

Many electronic devices include displays, such as light-emitting diode (LED) displays and liquid crystal displays (LCDs). These displays often include a pixel array having tens of thousands of pixels organized into a two-dimensional grid (e.g., circular grid, rectangular grid). To power and control the pixel array, displays may include driving circuitry, surrounding the perimeter of the pixel array, connecting the pixels to one or more drivers. As an example, a pixel array having a two-dimensional rectangular grid of pixels can be operably coupled to one or more row-line drivers via electrical traces (e.g., routing lines, wires) positioned around the rectangular grid.

Electronic device manufactures generally fabricate these displays in a layered structure, often referred to as a "display panel stack." The display panel stack includes a cover layer (e.g., cover glass) and a display panel module (e.g., pixel array, driving circuitry). Before a cover layer is bonded to the top of a display panel stack, an opaque border, often referred to as an "ink mask," may be added to the underside of the cover layer, defining a display bezel. An amount of space consumed by the driving circuitry (e.g., electrical traces, drivers) often dictates a size of the display bezel. The amount of space consumed by the driving circuitry can vary depending on a specific application of the electronic device and/or a form factor of the display panel stack. Frequently, the display bezel is enlarged for display panel stacks having noncollinear regions. For instance, a display bezel may be larger for an electronic device with a display panel stack that is elliptically shaped. In another example, an electronic device with a rectangular display panel stack includes corner regions with a larger display bezel.

Figure 1:
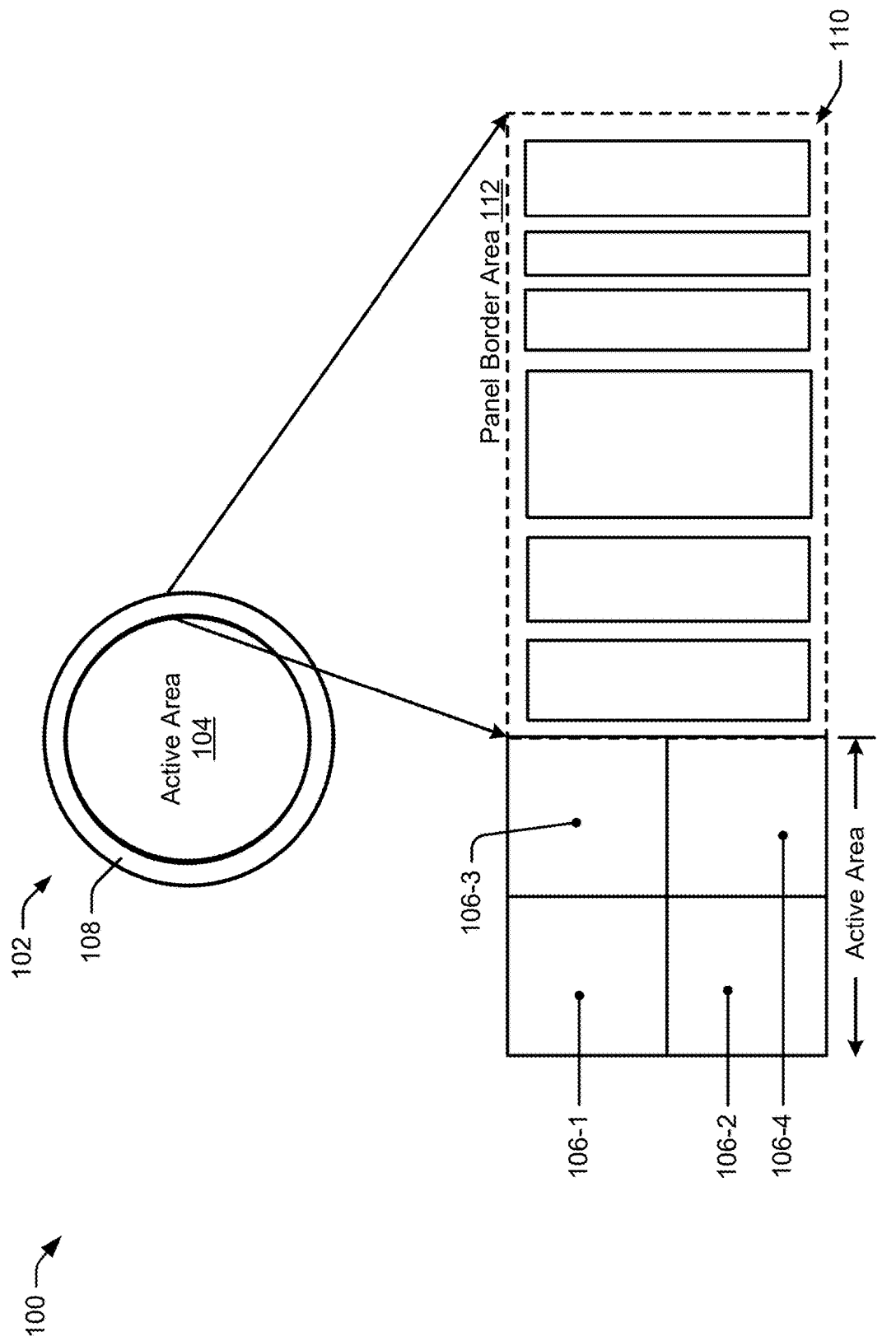
FIG. 1 illustrates an example implementation of an example display panel module with a display bezel and driving circuitry.

The display bezel may serve as a frame, surrounding an active area of a display (e.g., an emissive area of a display panel module visible to a user) and hiding driving circuitry in an inactive area (e.g., non-emissive area) of a display. FIG. 1 illustrates an example implementation 100 of an example display panel module with a display bezel and driving circuitry. As illustrated, a display panel module 102 includes an active area 104 having one or more pixels circuits 106 (e.g., a first pixel circuit 106-1, a second pixel circuit 106-2, a third pixel circuit 106-3, a fourth pixel circuit 106-4) surrounded by an opaque border 108 (e.g., display bezel). The opaque border 108 may be positioned over and visibly conceal driving circuitry 110 within a panel border area 112. In some implementations, an amount of space consumed by the driving circuitry 110 influences (e.g., dictates) a size of the opaque border 108 and/or the panel border area 112. For example, to provide enough space for the driving circuitry 110, the panel border area 112 may be 1-2 millimeters in width.

Users of electronic devices often desire compact, aesthetic electronic devices with large display active areas. However, many electronic devices include displays with large display bezels, which may reduce a display active area and minimize information content. Displays of electronic devices with a circular form factor that are also configured to be wearable on a body of a user (e.g., smartwatches) are especially prone to having displays with large display bezels.

To this end, this document describes systems and techniques directed at enlarging active areas of displays in electronic devices. In aspects, a display includes a grid of transistors positioned within a display panel module to control an illumination of one or more electroluminescent layers. Routing lines extend from one or more transistors of the grid of transistors to at least one electroluminescent layer. In this way, the at least one electroluminescent layer can be positioned away from the grid of transistors and disposed above portions of display panel module driving circuitry. As a result, active areas of displays can be enlarged and information content can be maximized without a panel border area allotted to the display panel module driving circuitry surrounding transistors having to be reduced.

Figure 2:
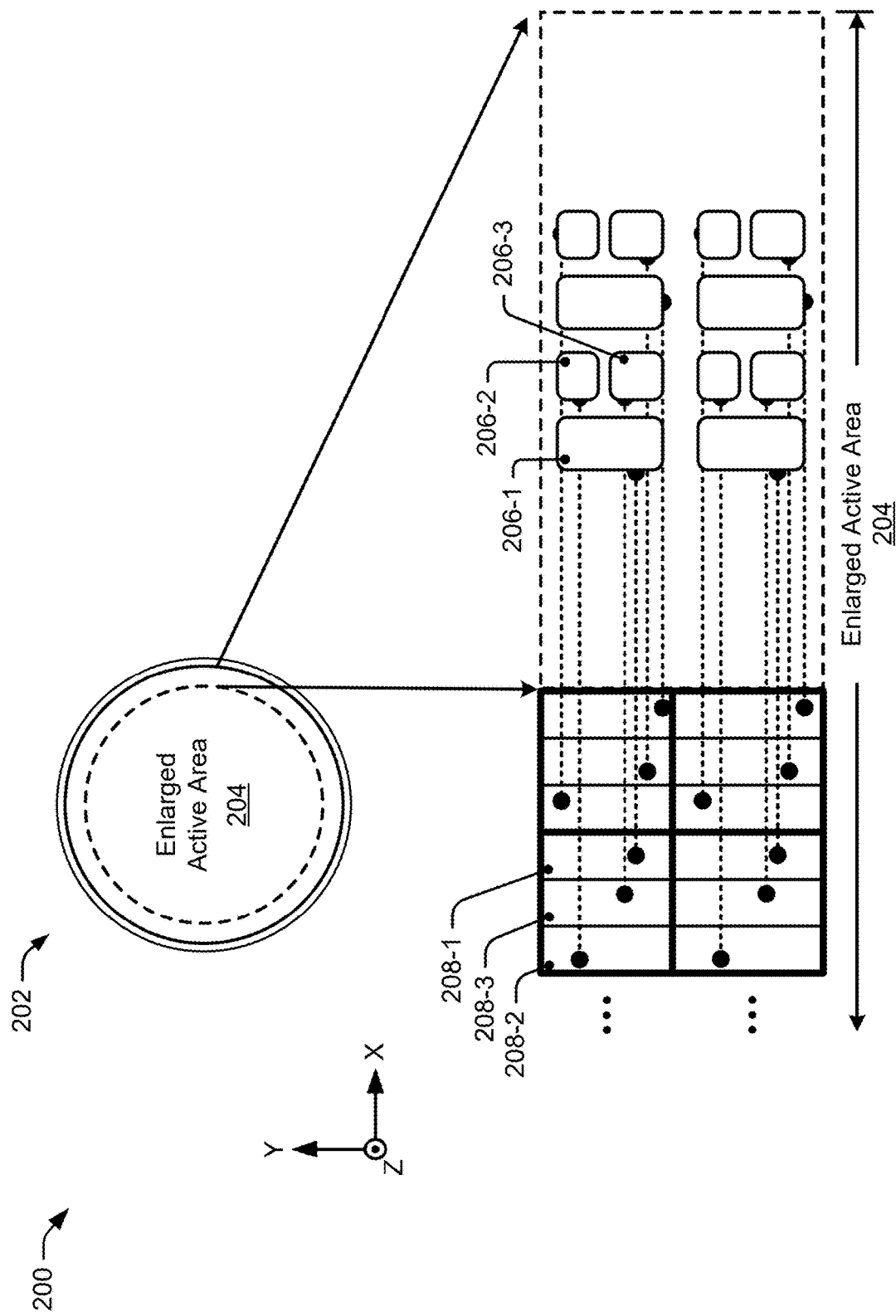
FIG. 2 illustrates an example implementation of an example display panel module in which an enlarged emitting area can be implemented in accordance with one or more implementations.

FIG. 2 illustrates an example implementation 200 of an example display panel module in which an enlarged emitting area can be implemented in accordance with one or more implementations. As illustrated, a display panel module 202 includes an enlarged active area 204 having one or more diodes 206 (e.g., a first diode 206-1, a second diode 206-2, a third diode 206-3) positioned over portions of driving circuitry (e.g., in a panel border area). For example, routing lines can extend from transistors 208 (e.g., a first transistor 208-1, a second transistor 208-2, a third transistor 208-3) within a grid of transistors to diodes 206 positioned above driving circuitry (e.g., at a higher Z-coordinate, closer to a cover layer). Through such a technique, diodes 206 can be disposed outward (e.g., radially outward) on an X-Y plane from the grid of transistors. As a result, an area allotted to driving circuitry surrounding the transistors 208 does not have to be reduced in order to achieve the enlarged active area 204. Instead, diodes 206 can be disposed above (e.g., at a higher Z-coordinate, underneath a cover layer but over the driving circuitry) the driving circuitry via electrical connection through routing lines to the transistors 208.

Although systems and techniques are described herein as being particularly relevant to smartwatches and elliptical displays, it is to be appreciated that the systems and techniques are also applicable to other electronic devices with irregular- or regular-shaped displays.

Example Environment

Figure 3:
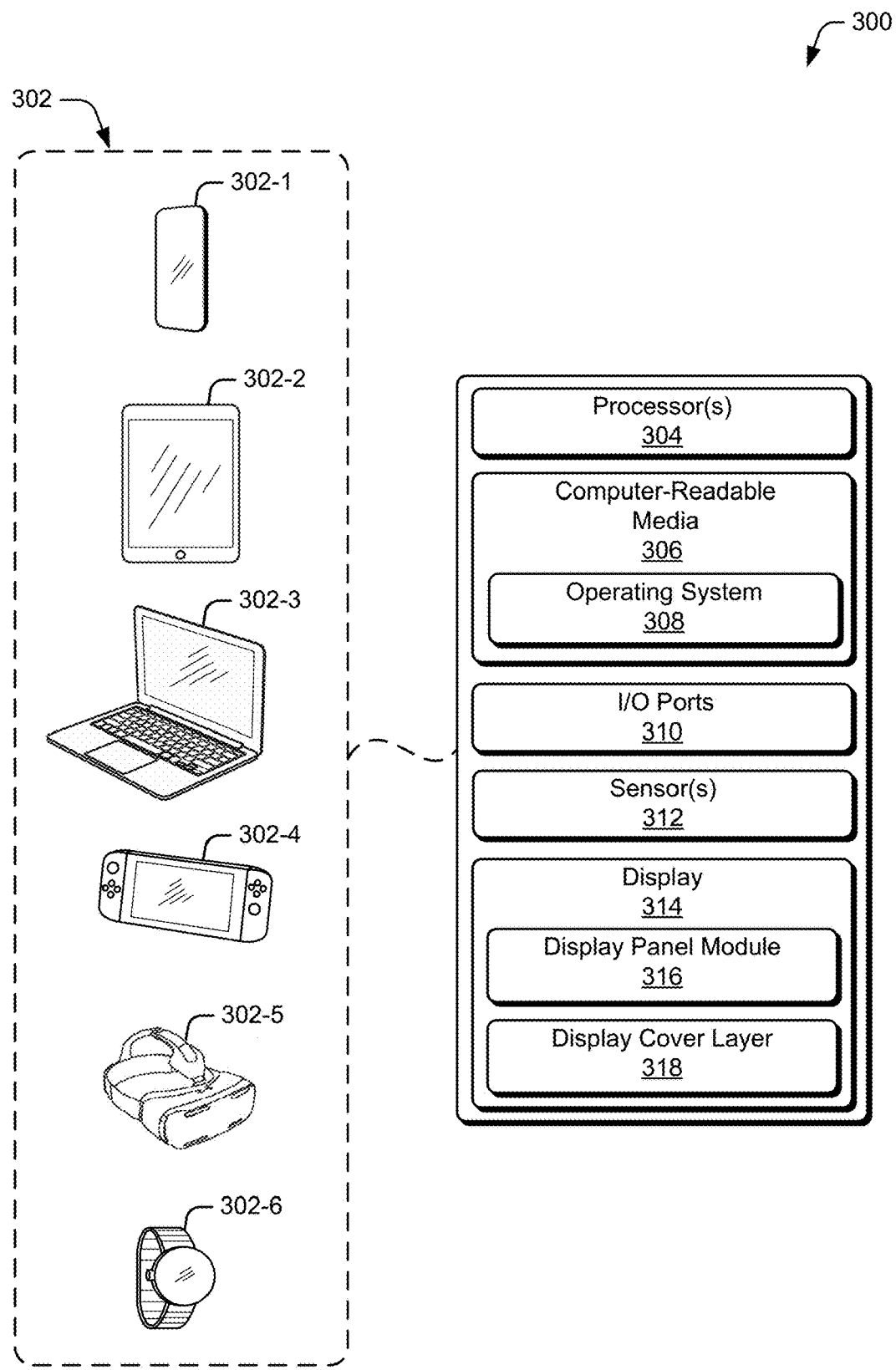
FIG. 3 illustrates an example device diagram of example electronic devices in which enlarged active areas can be implemented.

FIG. 3 illustrates an example device diagram 300 of example electronic devices in which enlarged active areas can be implemented. The electronic devices may include additional components and interfaces omitted from FIG. 3 for the sake of clarity.

An electronic device 302 can be any of a variety of consumer electronic devices. As non-limiting examples, the electronic device 302 can be a mobile phone 302-1, a tablet device 302-2, a laptop computer 302-3, a portable video game console 302-4, virtual-reality (VR) goggles 302-5, a smartwatch 302-6 (e.g., a computerized watch), and the like.

The electronic device 302 includes one or more processors 304. The processor(s) 304 can include, as non-limiting examples, a system on a chip (SoC), an application processor (AP), a central processing unit (CPU), or a graphics processing unit (GPU). The processor(s) 304 generally execute commands and processes utilized by the electronic device 302 and an operating system installed thereon. For example, the processor(s) 304 may perform operations to display graphics of the electronic device 302 on a display 314 and can perform other specific computational tasks.

The electronic device 302 also includes computer-readable storage media (CRM) 306. The CRM 306 may be a suitable storage device configured to store device data of the electronic device 302, user data, and multimedia data. The CRM 306 may store an operating system that generally manages hardware and software resources (e.g., applications) of the electronic device 302 and provides common services for applications stored on the CRM. The operating system and the applications are generally executable by the processor(s) 304 to enable communications and user interaction with the electronic device 302. One or more processor(s) 304, such as a GPU, perform operations to display graphics of the electronic device 302 on the display 314 and can perform other specific computational tasks. The processor(s) 304 can be single-core or multiple-core processors.

The electronic device 302 may also include input/output (I/O) ports 310. The I/O ports 310 allow the electronic device 302 to interact with other devices or users. The I/O ports 310 may include any combination of internal or external ports, such as universal serial bus (USB) ports, audio ports, Serial ATA (SATA) ports, PCI-express based ports or card-slots, secure digital input/output (SDIO) slots, and/or other legacy ports.

The electronic device 302 further includes one or more sensors 312. The sensor(s) 312 can include any of a variety of sensors, such as an audio sensor (e.g., a microphone), a touch-input sensor (e.g., a touchscreen), an image-capture device (e.g., a camera, video-camera), proximity sensors (e.g., capacitive sensors), or an ambient light sensor (e.g., photodetector). In implementations, the electronic device 302 includes one or more of a front-facing sensor(s) and a rear-facing sensor(s).

Further, the electronic device 302 includes the display 314 (e.g., a display panel stack) having a display panel module 316 and a cover layer 318. The display 314 may further include, integrated within the display panel module 316 or altogether separate from the display panel module 316, one or more of a touch layer (e.g., touch sensor panel) and a polarizer layer (e.g., polarization filters). In implementations, the display panel module 316 includes a two-dimensional pixel array operably coupled to one or more row-line or column-line drivers via electrical traces.

Pixels of the pixel array may be implemented as pixel circuits. The design of the pixel circuits may vary depending on the type of display technology implemented within the electronic device 302. For example, in organic light-emitting diode (OLED) displays, each pixel circuit can include a transistor (e.g., a thin-film transistor (TFT)) and one or more diodes (e.g., sub-pixels, electroluminescent layers) that emit red, green, blue, and/or infrared light. Although systems and techniques are described herein as being particularly relevant to OLED displays, it is to be appreciated that the systems and techniques may be used in conjunction with or applicable to other display technologies. Further, an electroluminescent layer may be considered to include any form of a layer or a region that is caused to emit light in response to a flow of an electric current through the layer or the region, or the application of an electric field across the layer or the region. An array formed of a plurality of electroluminescent layers may comprise an array of organic light-emitting diodes. Each of the plurality of electroluminescent layers may be associated with a corresponding transistor of a plurality of transistors. The plurality of transistors may be arranged in a grid or an array.

In aspects, the pixel array generates light to create an image on the display 314 upon electrical activation by one or more drivers. As an example, data-line drivers provide voltage data via electrical traces to pixel circuits of the pixel array to control a luminance of diodes. In at least some instances, sections of the display panel module 316 (e.g., a bottom section, a rounded corner) may include more driving circuitry and/or a larger panel border area than other portions of the display panel module 316 (e.g., a top section, a collinear side section).

FIG. 4 illustrates an example implementation 400 of a smartwatch 302-6 and an exploded view of an example display 314 having a display panel module 316, a display cover layer 318, and integrated circuits 404. The display cover layer 318 may be composed of any of a variety of translucent materials including polymer (e.g., plastic, acrylic), glass, and so forth and may form any three-dimensional shape (e.g., a polyhedron), such as a rectangular prism or cylinder. During manufacturing of the display 314, an opaque border 402 may be added (e.g., laminated, printed) to a bottom face (e.g., underside) of the cover layer 318. As an example, the opaque border 402 is a black ink mask adhered to the bottom face of the cover layer 318. The opaque border 402 may have an inner diameter and an outer diameter. The difference between the inner diameter and the outer diameter may define a thickness of the opaque border 402. The bottom face of the cover layer 318 may then be bonded to the display panel module 316, forming a display panel stack. In some implementations, a width and/or a length of the display panel module 316, when packaged in an electronic device 302, is less than or equal to a width and/or a length, respectively, of the cover layer 318. In alternative implementations, a width and/or a length of the display panel module 316, when packaged in an electronic device 302, is greater than a width and/or a length, respectively, of the cover layer 318. For example, portions of display panel module 316, including driving circuitry, may extend beyond the cover layer 318 but may be hidden by a housing of an electronic device 302.

As further illustrated, an enlarged active area 408 includes pixel circuits 410 (e.g., pixel circuit 410-1, pixel circuit 410-2, pixel circuit 410-3, pixel circuit 410-4). Each pixel circuit 410 may include one or more transistors 412. For example, pixel circuit 410-1 may include a first transistor 412-1, a second transistor 412-2, and a third transistor 412-3 to control one or more diodes (not illustrated).

In implementations, the opaque border 402 hides at least portions of driving circuitry in a panel border area 406 of the display panel module 316 and frames the enlarged active area 408. In this way, at least portions of the driving circuitry can be hidden from a user's perception while viewing the display 314. As an example only and not by way of limitation, the driving circuitry includes, as illustrated in FIG. 4, a compensation capacitor 414, a high-level power supply voltage source ("ELVDD") 416 (e.g., OLED display positive power supply), a demultiplexer circuit 418, a gate driver on array 420 (GOA 420), source lines 422 (e.g., source drivers), and a low-level power supply voltage source ("ELVSS") 424 (e.g., OLED display negative power supply). The panel border area 406 may further include a dam portion 426 (e.g., a patterned insulator film surrounding a periphery of an active area) and a crack dam 428 (e.g., a crack-prevention dam).

The compensation capacitor 414 may be configured to maintain a constant voltage across one or more diodes (e.g., one or more electroluminescent layers). The demultiplexer circuit 418 (e.g., a one to six (1:6) demultiplexer) may be configured to take one or more input signals and route them to one of several output lines based on a state of control inputs. The GOA 420 may include gate lines that run horizontally (e.g., parallel to the row direction) along the width of the display 314. The gate lines may connect to rows of pixel circuits 410 and send signals that activate the transistors 412. In implementations, the transistors 412 can control current flow, enabling or disabling current to flow through the one or more diodes. The source lines 422 may run vertically (e.g., perpendicular to a row direction) along the length of the display 314 from one or more display drivers and connect to the demultiplexer circuit 418. The dam portion 426 and the crack dam 428 may include a patterned insulator film configured to prevent crack propagation and external forces from peeling off an encapsulation film.

It will be appreciated by one skilled in the art that FIG. 4 is provided as an example only, for the techniques described herein are also applicable to electronic devices that include additional or fewer driving circuit components than those illustrated in FIG. 4. Moreover, an arrangement of driving circuit components in electronic devices may differ than those illustrated in FIG. 4 and still utilize the techniques described herein.

Figure 5A:
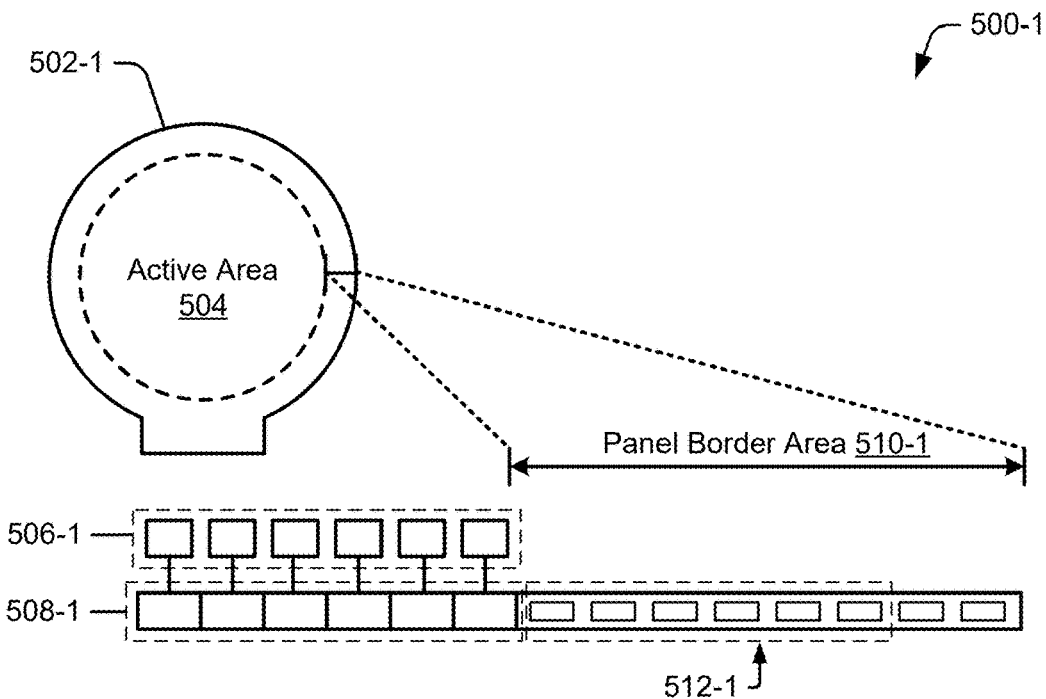
FIGS. 5A and 5B illustrate a first example implementation of a first display panel module and a second example implementation of a second display panel module, respectively.
Figure 5B:
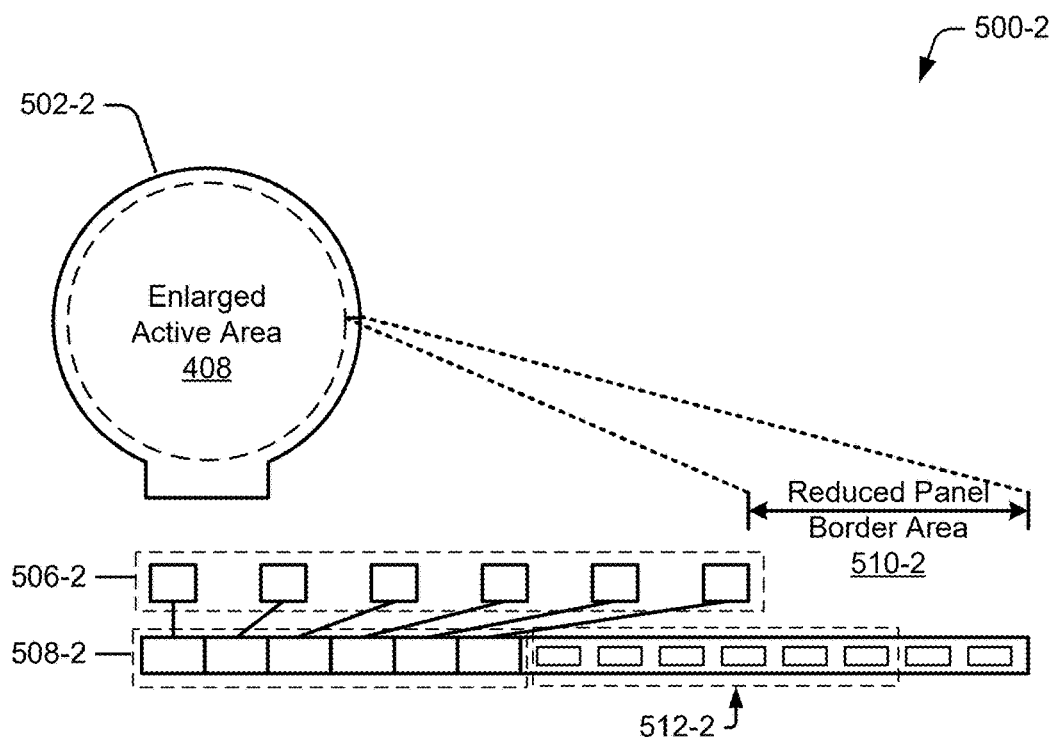

FIGS. 5A and 5B illustrate a first example implementation 500-1 of a first display panel module 502-1 and a second example implementation 500-2 of a second display panel module 502-2, respectively. As illustrated in FIG. 5A, the first display panel module 502-1 has an active area 504 (e.g., active area 104) that includes a plurality of diodes 506-1 (e.g., red, green, blue (RGB) diodes) operatively coupled to transistors 508-1. Further illustrated, a width of a panel border area 510-1 of the display panel module 502-1 may be larger than a width of a driving circuitry 512-1. As an example, the panel border area 510-1 can range from 1.2 to 1.6 millimeters. In alternative implementations (not illustrated), the width of the panel border area 510-1 of the display panel module 502-1 may be equal to the width of the driving circuitry 512-1.

FIG. 5B, on the other hand, illustrates the second display panel module 502-2 having the enlarged active area 408, which is larger than the active area 504 of the first display panel module 502-1. The second display panel module 502-2 can include the enlarged active area 408 by overlaying one or more diodes (e.g., electroluminescent layers) of a plurality of diodes 506-2 over at least portions of driving circuitry 512-2. In this way, at least portions of the driving circuitry 512-2 can be hidden by the one or more diodes, resulting in a reduced panel border area 510-2 that can be hidden by a thinner opaque border (e.g., opaque border 402). As a result, a user can visually perceive an enlarged viewing area (e.g., the active area 408) with a narrower opaque border. Through such a technique, a panel border area (e.g., panel border area 510-1) can be reduced by 0.2 to 1.0 millimeters, for example. A thickness of the opaque border, which may be defined as the difference between the inner diameter and the outer diameter of the opaque border, may be selected such that it hides one or more components driving circuitry 512-2 (e.g., components of the driving circuitry 512-2 over which an extended emitting area does not extend). For example, the thickness of the opaque border can be based on a placement of an electroluminescent layer above portions of the driving circuitry 512-2, since such placement allows the electroluminescent layers to hide the driving circuitry 512-2.

In at least some implementations, a pixel per inch (PPI) (e.g., a number of pixels in a display per one inch of its diagonal length, a measure of resolution, a density of pixels) of the display panel module 502-2 may be uniform across the entire enlarged active area 408. In other implementations, an inner region of the enlarged active area 408 may possess a first uniform PPI, while an outer region (e.g., where diodes have been extended outward) of the enlarged active area 408 may possess a second uniform PPI. The first uniform PPI may be greater than the second uniform PPI. A difference between the first uniform PPI and the second uniform PPI may be visually imperceptible to a user. In still further implementations, a density of transistors (e.g., transistors 508-2) within the enlarged active area 408 may be greater than a density of pixels (e.g., a red, green blue (RGB) pixel) and/or diodes 506-2.

Figure 6:
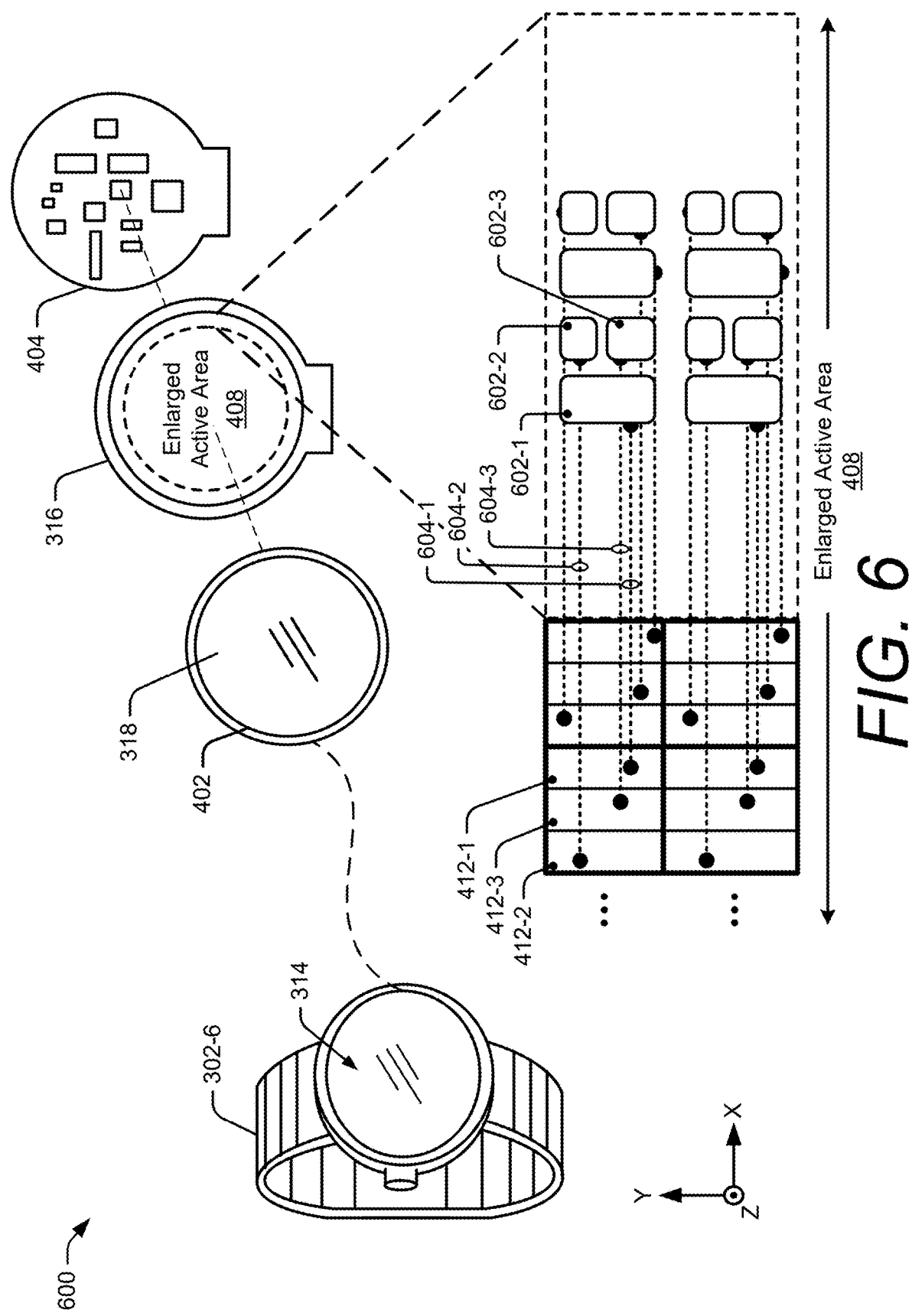
FIG. 6 illustrates an example implementation of a smart-watch and an exploded view of an example display with diodes overlaying portions of driving circuitry in accordance with one or more implementations.

FIG. 6 illustrates an example implementation 600 of a smartwatch 302-6 and an exploded view of an example display 314 with diodes 602 overlaying portions of driving circuitry (e.g., driving circuitry 512-2) in accordance with one or more implementations. As illustrated, the enlarged active area 408 is enlarged (e.g., in comparison to active area 504) by positioning diodes 602 over portions of driving circuitry (see FIG. 4 and/or FIG. 5B). For example, routing lines 604 (e.g., routing line 604-1, routing line 604-2, routing line 604-3) can extend from transistors 412 (e.g., transistor 412-1, transistor 412-2, transistor 412-3) to diodes 602 (e.g., diode 602-1, diode 602-2, diode 602-3) positioned above driving circuitry (e.g., at a higher Z-coordinate, closer to a cover layer), enabling the diodes 602 to be disposed radially outward on an X-Y plane from the transistors 412. As a result, an area allotted to driving circuitry surrounding the transistors 412 does not have to be reduced in order to enlarge an active area. Instead, diodes 602 can be disposed above the driving circuitry via electrical connection through the routing lines 604 to the transistors 412.

In implementations, the routing lines 604 (e.g., metal interconnects) can be composed of any of a variety of materials, including titanium, aluminum, copper, or a combination thereof. Further, the routing lines 604 may extend (e.g., vertically, horizontally) tens and/or hundreds of micrometers or millimeters from a respective transistor (e.g., transistor 412-2) to a respective diode (e.g., diode 602-2). The routing lines 604 may be configured to route electrical signals and/or power to the diodes 602. The diodes 602 (e.g., sub-pixels, electroluminescent layers) can, individually or collectively, emit light of varying wavelengths (e.g., visible light, infrared light). In one example, the diode 602-1 is a diode configured to emit blue light.

Figure 7:
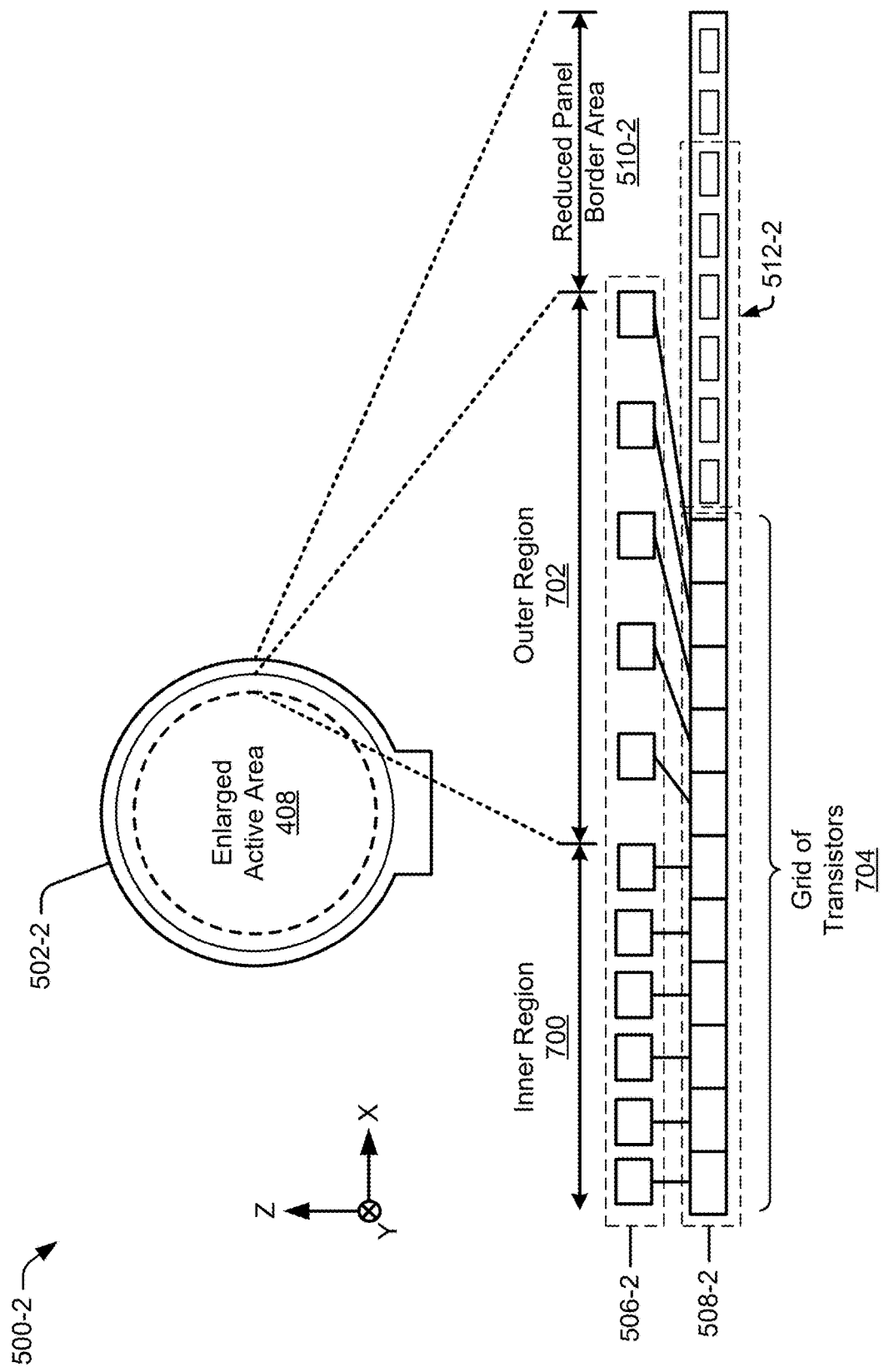
FIG. 7 illustrates the second example implementation of the second display panel module with more detail in accordance with one or more implementations.

FIG. 7 illustrates the second example implementation 500-2 of the second display panel module 502-2 with more detail in accordance with one or more implementations. FIG. 7 is described in the context of FIGS. 3, 4, 5B, and 6. As illustrated, the second display panel module 502-2 includes the enlarged active area 408, the plurality of diodes 506-2, the transistors 508-2, and the driving circuitry 512-2. The second display panel module 502-2 can include the enlarged active area 408 by overlaying one or more diodes (e.g., electroluminescent layers) of the plurality of diodes 506-2 over at least portions of the driving circuitry 512-2.

As illustrated, the plurality of diodes 506-2 may be divided between an inner region 700 and an outer region 702. The inner region 700 may include a first set of diodes of the plurality of diodes 506-2, while the outer region 702 may include a second set of diodes of the plurality of diodes 506-2. In implementations, as illustrated in FIG. 7, the second set of diodes includes at least one diode that is positioned away from a grid of transistors 704 in at least one dimension of an X-Y plane (e.g., an X-axis, a Z-axis). In additional implementations, the outer region 702 may be defined from a border of the inner region 700 to a border of the enlarged active area 408. The outer region 702 may extend along an entire outer perimeter of the enlarged active area 408. As described herein, the term grid is to be understood as describing a two- or three-dimensional network of elements, such as transistors, arranged in one or more patterns.

The grid of transistors 704 may form any of a variety of regular (e.g., rectangular, elliptical) or irregular shapes. In implementations, the grid of transistors 704 is dimensionally smaller (e.g., with respect to the X-Y plane) than the enlarged active area 408 (e.g., pixel array, the inner region 700 and the outer region 702). In further implementations, as illustrated in FIG. 7, the grid of transistors 704 may be concentric with the enlarged active area 408. In alternative implementations, the grid of transistors 704 and the enlarged active area 408 may each have a geometric center (e.g., an origin), which are offset any number of micrometers or millimeters in an X-Y plane. The grid of transistors 704 may have a uniform distribution of transistors.

Further illustrated, the first set of diodes of the plurality of diodes 506-2 may include a first density of diodes. The first density of diodes may be uniform over an entirety of the inner region 700. The second set of diodes of the plurality of diodes 506-2 may include a second density of diodes. In at least some implementations, the second density of diodes is uniform over an entirety of the outer region 702. The first density of diodes may be greater than the second density of diodes. In alternative implementations, the second density of diodes is non-uniform over an entirety of the outer region 702. In still further implementations, one or more diodes in the second set of diodes may be dimensionally larger than diodes in the first set of diodes, and/or diodes in the second set of diodes may be arranged in a different pattern than diodes in the inner region 700.

Figure 8:
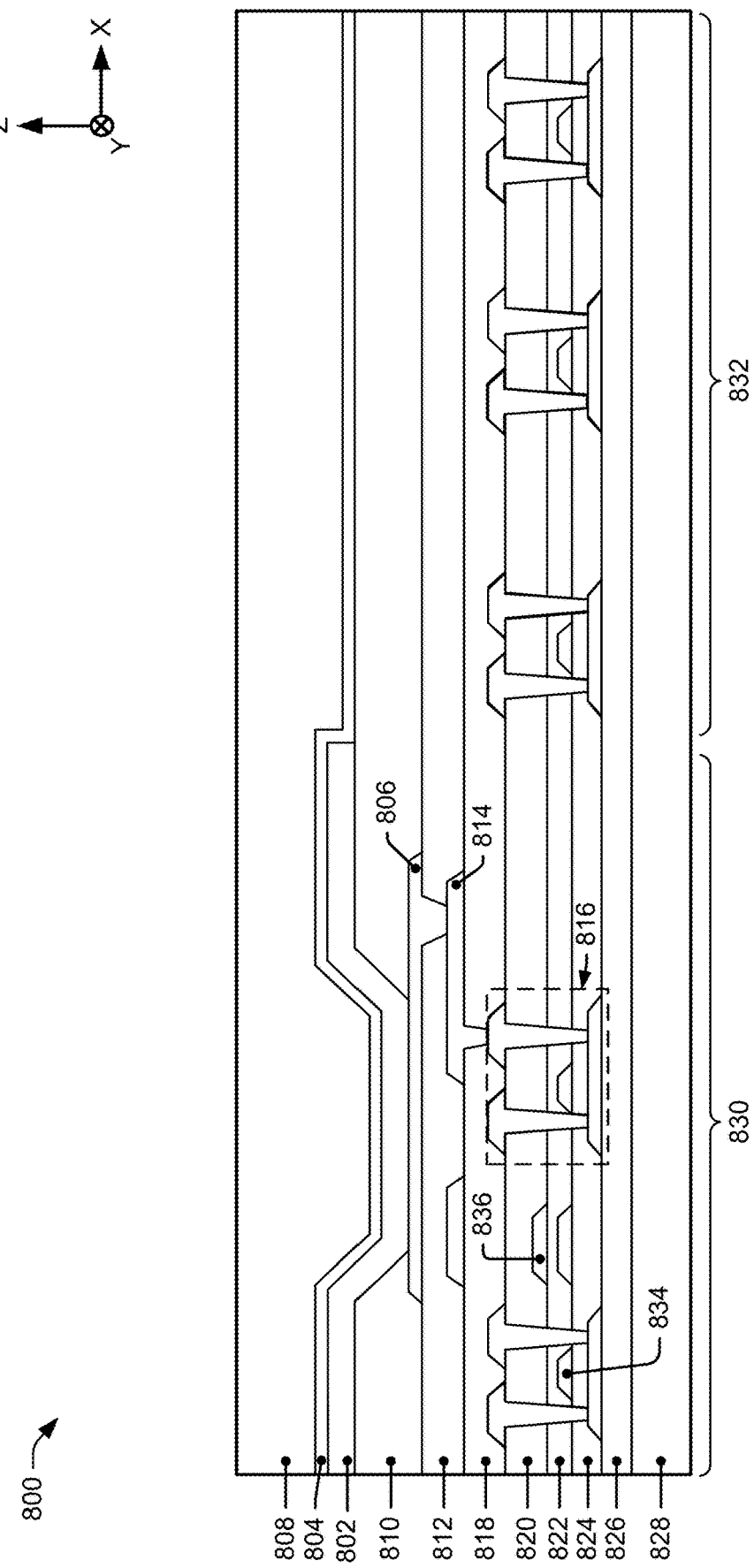
FIG. 8 illustrates a partial, cross-sectional view of an example display panel module.

FIG. 8 illustrates a partial, cross-sectional view 800 of an example display panel module (e.g., display panel module 102). FIG. 8 is described in the context of FIGS. 1 and 5A. As illustrated, the display panel module includes an electroluminescent layer 802 (e.g., diode 602-1). In implementations, the electroluminescent layer 802 is composed of organic materials that emit light of varying wavelengths and/or intensities depending on an amount of electrical current passed through it (e.g., electroluminescence).

As illustrated, the electroluminescent layer 802 is positioned between a cathode 804 and an anode 806. The electroluminescent layer 802 may emit light when a voltage is applied across the cathode 804 and the anode 806. Disposed above the cathode 804 is a thin-film encapsulation (TFE) layer 808 (e.g., a metal encapsulation). The TFE layer 808 is a transparent material configured to protect the display panel module from ingress contaminates, such as dust and moisture. Disposed below the electroluminescent layer 802, adjacent to the cathode 804 and the anode 806, is a pixel define layer 810 (PDL 810). Beneath the PDL 810, a planarization layer 812 ("PLN2" 812) may be disposed. Both PDL 810 and PLN2 812 may be composed of electrically insulating materials.

Further illustrated, a routing line 814 is operatively coupled (e.g., electrically connected) to the anode 806 and an electrode of a transistor 816 (e.g., a coplanar oxide thin-film transistor). In one example, the routing line 814 is operatively coupled to the anode 806 and a drain electrode of a low-temperature polycrystalline silicon (LTPS) p-type thin-film transistor 816. Further, the display panel module includes another planarization layer 818 ("PLN1" 818), an inter-layer dielectric (ILD) layer 820, a first gate insulator (GI) layer 822, and a second GI layer 824. The ILD layer 820 may be composed of an organic- or inorganic-insulating material configured to separate and isolate sub-pixel drive components. The GI layers (e.g., GI layer 822, GI layer 824) may be implemented as thin layers of, for example, silicon dioxide or silicon nitride. The GI layers may be configured to provide a barrier between a gate electrode and organic materials in the display panel module, preventing metals from reacting with organic materials. Further, the GI layers may assist in managing (e.g., controlling) a flow of current through the display panel module.

In addition, the display panel module includes a buffer layer 826 and a polyimide ("PI") substrate 828. The buffer layer 826 can be configured to reduce electrical resistance, improve adhesion between layers, prevent chemical reactions between different layers, and/or protect the display panel module from ingress contaminants. The PI substrate 828 provides mechanical stability and serves as a flexible base for other layers. FIG. 8 also illustrates the division between an active area 830 (e.g., active area 104) and driving circuitry 832 (e.g., driving circuitry 512-1). Further, FIG. 8 illustrates a first gate line 834 patterned in the GI layer 822 and a second gate line 836 patterned in the ILD layer 820.

Figure 9:
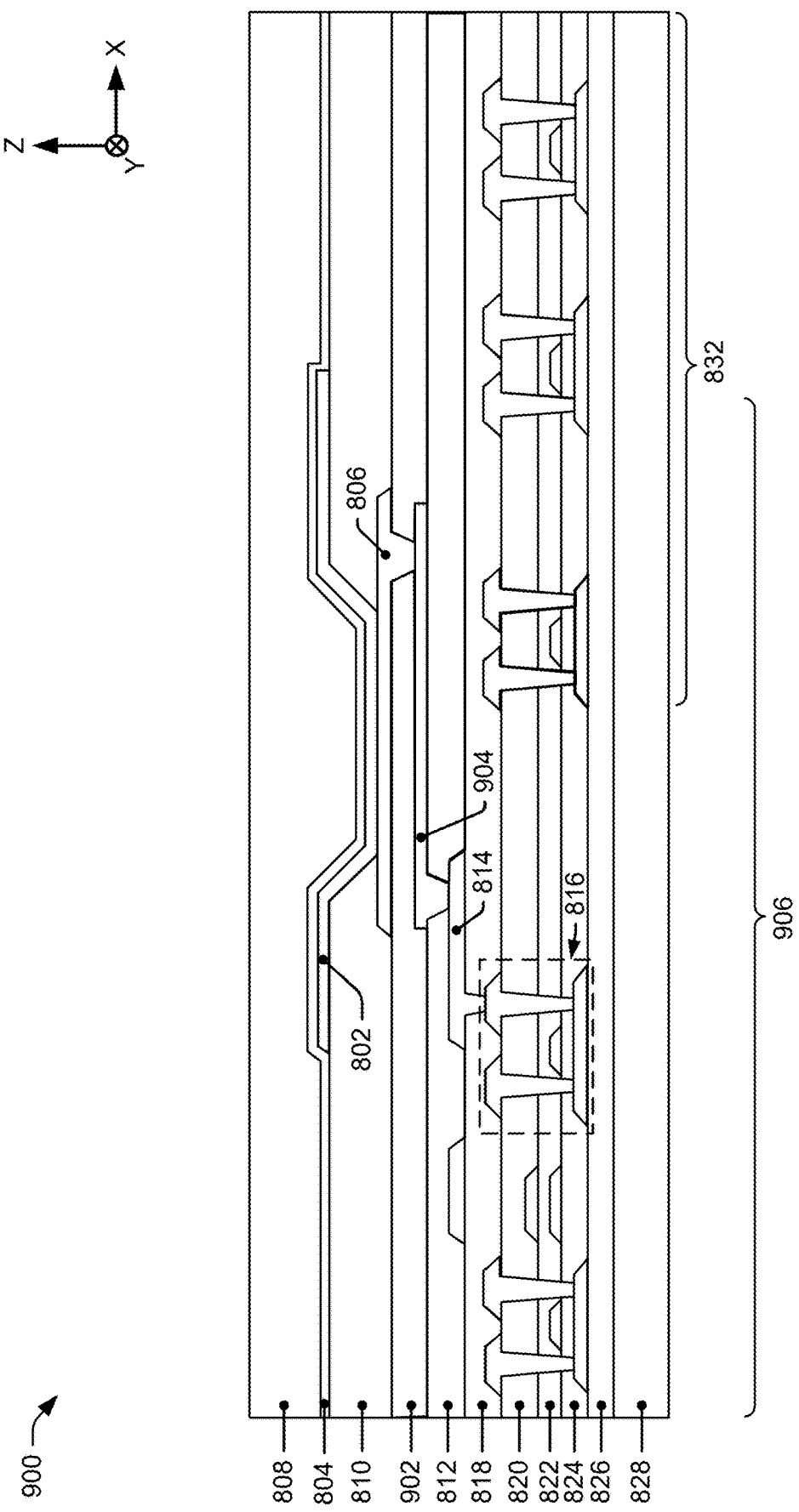
FIG. 9 illustrates a partial, cross-sectional view of an example display panel module that is configured with an enlarged active area in accordance with one or more implementations.

FIG. 9 illustrates a partial, cross-sectional view 900 of an example display panel module (e.g., display panel module 316) that is configured with an enlarged active area (e.g., enlarged active area 408) in accordance with one or more implementations. FIG. 9 is described in the context of FIGS. 3, 4, 5B, 6, and 7. The display panel module includes one or more components of the display panel module from FIG. 8. Common parts are shown with like reference numerals and may not be described again.

As illustrated, the display panel module includes a third planarization layer 902 ("PLN3" 902) and a routing metal 904. In such a configuration, PLN2 812 physically supports and electrically insulates the routing line 814 and the routing metal 904, while PLN3 physically supports and electrically insulates the routing metal 904 and the anode 806. In aspects, the routing metal 904 can extend from and operatively couple (e.g., electrically connect) the routing line 814 to the anode 806. Through the addition of the routing metal 904, the electroluminescent layer 802 can be positioned at an X, Y, and/or Z three-dimensional coordinate independent of an X, Y, and/or Z three-dimensional coordinate of the transistor 816. For example, the electroluminescent layer 802 can be disposed a few micrometers or millimeters away from the transistor 816 in an X-Y plane. In this way, one or more electroluminescent layers 802 (e.g., diodes) can be overlaid above (e.g., at a higher Z location) at least portions of the driving circuitry 832 (e.g., driving circuitry 512-2), and an emitting area can be extended to produce an enlarged active area 906.

Figure 10:
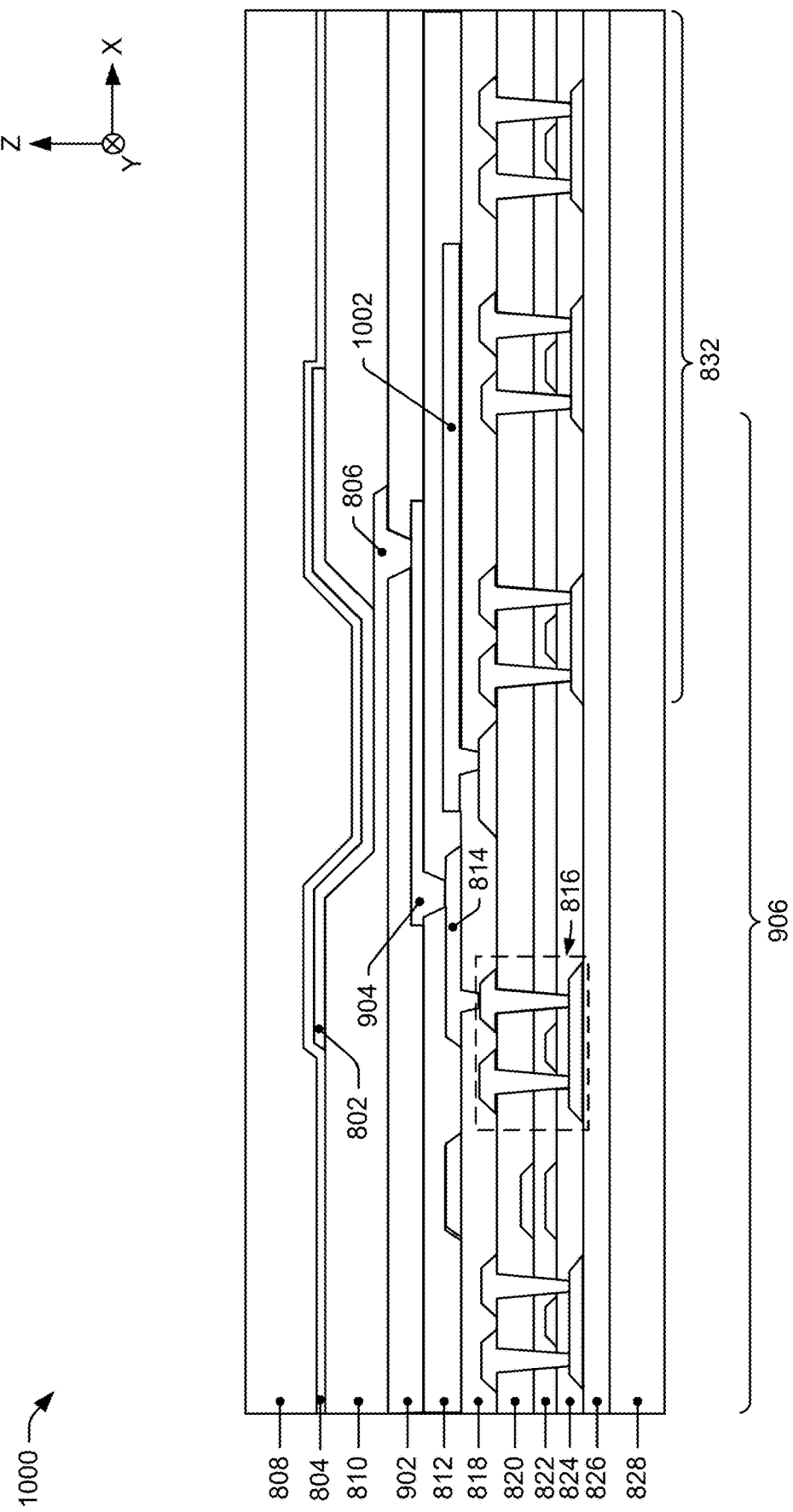
FIG. 10 illustrates a partial, cross-sectional view of another example display panel module that is configured with an enlarged active area in accordance with one or more implementations.

FIG. 10 illustrates a partial, cross-sectional view 1000 of another example display panel module (e.g., display panel module 316) that is configured with an enlarged active area (e.g., enlarged active area 408) in accordance with one or more implementations. FIG. 10 is described in the context of FIGS. 3, 4, 5B, 6, and 7. The display panel module includes one or more components of the display panel module from FIG. 8 and/or FIG. 9. Common parts are shown with like reference numerals and may not be described again.

As illustrated, the display panel module includes a shielding conductor layer 1002. In such a configuration, PLN2 812 and PLN1 818 physically support and electrically insulate the shielding conductor layer 1002. The shielding conductor layer 1002 may be operatively coupled to a direct current (DC) reference voltage from a high-level power supply voltage source (e.g., ELVDD 416), a low-level power supply voltage source (e.g., ELVSS 424), or other electrodes. The shielding conductor layer 1002 can be composed of any of a variety of materials and can be disposed at any position below the anode 806 and/or routing metal 904. Through the addition of the shielding conductor layer 1002, the anode 806 may be shielded from parasitic coupling capacitances originating from the driving circuitry 832. As a result, a voltage of the anode 806 ("anode voltage") can be insulated from, for example, the demultiplexer circuit 418, the GOA 420, clock bus lines, and/or the source lines 422. The shielding conductor layer 1002 can, therefore, mitigate anode voltage fluctuations resulting in undesirable display artifacts, including a line mura, a band mura, and display flickering.

In at least some implementations, a routing pitch of the routing metal 904 may be held to less than five (5) micrometers. Further to the above descriptions, a size of a respective electroluminescent layer (e.g., electroluminescent layer 702) may differ from a size of another electroluminescent layer within a single display panel module. For example, electroluminescent layers within an inner region (e.g., inner region 700) may be smaller than electroluminescent layers within an outer region (e.g., outer region 702) of an enlarged active area (e.g., enlarged active area 408).

CONCLUSION

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying Drawings and terms discussed herein may be indicative of one or more items or terms, and thus reference may be made interchangeably to single or plural forms of the items and terms in this written description.

Terms such as "above" or "below" are not intended to require any particular orientation of a device. Rather, a first layer or component, being provided "above" a second layer or component is intended to describe the first layer being at a higher Z-dimension than the second layer of component within the particular coordinate system in use. It will be understood that should the component be provided in another orientation, or described in a different coordinate system, then such relative terms may be changed.

Although implementations for enlarging active areas of displays in electronic devices have been described in language specific to certain features and/or methods, the subject of the appended Claims is not necessarily limited to the specific features or methods described. Rather, the specific features and methods are disclosed as example implementations for enlarging active areas of displays in electronic devices.

What is claimed is:

1. A display comprising:
a cover layer positioned as a topmost layer;
an electroluminescent layer positioned underneath the cover layer and configured to emit light when a voltage is applied across a cathode and an anode;
a transistor configured to control an electrical activation of the electroluminescent layer by controlling the voltage across the cathode and the anode;
driving circuitry positioned underneath the cover layer and operatively coupled to the transistor, the driving circuitry configured to control the transistor;
a shielding conductor layer configured to shield the anode from parasitic coupling capacitances originating from the driving circuitry, the shielding conductor layer operatively coupled to a direct current reference voltage;
a routing line connected to an electrode of the transistor; and
a routing metal operatively coupling the anode of the electroluminescent layer to the routing line, the routing metal extending from the routing line above at least portions of the driving circuitry, and
the electroluminescent layer disposed above the at least portions of the driving circuitry such that the electroluminescent layer is positioned between the cover layer and the driving circuitry.

2. The display of claim 1, wherein the driving circuitry comprises at least one of a compensation capacitor, a high-level power supply voltage source, a demultiplexer circuit, a gate driver on array, source lines, or a low-level power supply voltage source.

3. The display of claim 2, wherein:
the driving circuitry comprises the demultiplexer circuit and the gate driver on array; and
the routing metal and the electroluminescent layer are disposed above at least one of the demultiplexer circuit or the gate driver on array.

4. The display of claim 1, wherein the shielding conductor layer is disposed at least partially underneath the routing metal.

5. The display of claim 1, wherein:
the electroluminescent layer is one of a plurality of electroluminescent layers, each electroluminescent layer of the plurality of electroluminescent layers having a respective cathode and a respective anode, and wherein the plurality of electroluminescent layers form an array;
the transistor is one of a plurality of transistors, each transistor of the plurality of transistors being associated with a respective electroluminescent layer of the plurality of electroluminescent layers, and wherein the plurality of transistors form a grid;
the routing line is one of a plurality of routing lines, each routing line of the plurality of routing lines being operatively coupled to a respective transistor of the plurality of transistors; and
the routing metal is one of a plurality of routing metals, each routing metal of the plurality of routing metals operatively coupling the anode of a respective electroluminescent layer of the plurality of electroluminescent layers to a respective routing line of the plurality of routing lines.

6. The display of claim 5, wherein:
the array of electroluminescent layers comprises a uniform density of electroluminescent layers;
the grid of transistors comprises a uniform density of transistors; and
the array of electroluminescent layers comprises a larger area than the grid of transistors.

7. The display of claim 5, wherein:
the array of electroluminescent layers comprises an inner region and an outer region;
the inner region comprises a first density of electroluminescent layers; and
the outer region comprises a second density of electroluminescent layers.

8. The display of claim 7, wherein the first density of electroluminescent layers is greater than the second density of electroluminescent layers.

9. The display of claim 7, wherein one or more electroluminescent layers in the outer region are disposed above at least portions of the driving circuitry.

10. The display of claim 7, wherein the outer region extends along an entire outer perimeter of the array of electroluminescent layers.

11. The display of claim 1, wherein the display comprises an elliptical form factor.

12. The display of claim 1, wherein the electroluminescent layer comprises a red diode, a green diode, a blue diode, or an infrared diode.

13. The display of claim 1, wherein the display further comprises:
an opaque border bonded to a bottom face of the cover layer, the opaque border having an outer diameter and an inner diameter, and wherein a thickness between the inner diameter and the outer diameter is based on a placement of the electroluminescent layer above the at least portions of the driving circuitry.

14. A wearable device comprising:
a housing;
one or more processors disposed within the housing; and
a display operably coupled to the one or more processors and at least partially disposed within the housing, the display comprising:
   a cover layer positioned as a topmost layer, the cover layer including an opaque border having an outer diameter and an inner diameter;
   an electroluminescent layer positioned underneath the cover layer and configured to emit light when a voltage is applied across a cathode and an anode;
   a transistor configured to control an electrical activation of the electroluminescent layer by controlling the voltage across the cathode and the anode;
   driving circuitry positioned underneath the cover layer and operatively coupled to the transistor, the driving circuitry configured to control the transistor;
   a routing line connected to an electrode of the transistor; and
   a routing metal operatively coupling the anode of the electroluminescent layer to the routing line, the routing metal extending from the routing line above at least portions of the driving circuitry, and
   the electroluminescent layer disposed above the at least portions of the driving circuitry such that the electroluminescent layer is positioned between the cover layer and the driving circuitry, and a thickness between the inner diameter and the outer diameter based on a placement of the electroluminescent layer above the at least portions of the driving circuitry.

15. The wearable device of claim 14, wherein:
the electroluminescent layer is one of a plurality of electroluminescent layers, each electroluminescent layer of the plurality of electroluminescent layers having a respective cathode and a respective anode, and wherein the plurality of electroluminescent layers form an array;
the transistor is one of a plurality of transistors, each transistor of the plurality of transistors being associated with a respective electroluminescent layer of the plurality of electroluminescent layers, and wherein the plurality of transistors form a grid;
the routing line is one of a plurality of routing lines, each routing line of the plurality of routing lines being operatively coupled to a respective transistor of the plurality of transistors; and
the routing metal is one of a plurality of routing metals, each routing metal of the plurality of routing metals operatively coupling the anode of a respective electroluminescent layer of the plurality of electroluminescent layers to a respective routing line of the plurality of routing lines.

16. The wearable device of claim 15, wherein:
the array of electroluminescent layers comprises a uniform density of electroluminescent layers;
the grid of transistors comprises a uniform density of transistors; and
the array of electroluminescent layers comprises a larger area than the grid of transistors.

17. The wearable device of claim 15, wherein:
the array of electroluminescent layers comprises an inner region and an outer region;
the inner region comprises a first density of electroluminescent layers; and
the outer region comprises a second density of electroluminescent layers.

18. The wearable device of claim 17, wherein at least one of:
the first density of electroluminescent layers is greater than the second density of electroluminescent layers; or
one or more electroluminescent layers in the outer region are disposed above at least portions of the driving circuitry.

19. The wearable device of claim 17, wherein the display comprises an elliptical form factor.

20. The wearable device of claim 14, wherein the display further comprises:
a shielding conductor layer configured to shield the anode from parasitic coupling capacitances originating from the driving circuitry, the shielding conductor layer operatively coupled to a direct current reference voltage.

21. A display comprising:
a cover layer positioned as a topmost layer, the cover layer including an opaque border having an outer diameter and an inner diameter;
an electroluminescent layer positioned underneath the cover layer and configured to emit light when a voltage is applied across a cathode and an anode;
a transistor configured to control an electrical activation of the electroluminescent layer by controlling the voltage across the cathode and the anode;
driving circuitry positioned underneath the cover layer and operatively coupled to the transistor, the driving circuitry configured to control the transistor;
a routing line connected to an electrode of the transistor; and
a routing metal operatively coupling the anode of the electroluminescent layer to the routing line, the routing metal extending from the routing line above at least portions of the driving circuitry, and
the electroluminescent layer disposed above the at least portions of the driving circuitry such that the electroluminescent layer is positioned between the cover layer and the driving circuitry, and a thickness between the inner diameter and the outer diameter based on a placement of the electroluminescent layer above the at least portions of the driving circuitry.

* * * * *